United States Patent [19]
Suse et al.

[11] Patent Number: 5,292,376
[45] Date of Patent: Mar. 8, 1994

[54] THERMOELECTRIC REFRIGERATION MATERIAL AND METHOD OF MAKING THE SAME

[75] Inventors: Yasuo Suse; Akira Kawamoto, both of Ibaraki, Japan

[73] Assignee: Kabushiki Kaisha Toshiba, Kanagawa, Japan

[21] Appl. No.: 853,127

[22] Filed: Mar. 18, 1992

[30] Foreign Application Priority Data

Mar. 18, 1991 [JP] Japan .................................. 3-078556

[51] Int. Cl.⁵ ...................... H01L 35/14; H01L 35/20
[52] U.S. Cl. .................................. 136/239; 136/201; 136/203; 136/240
[58] Field of Search ...................... 136/236.1, 239, 240, 136/203, 201

[56] References Cited

U.S. PATENT DOCUMENTS

| | | | |
|---|---|---|---|
| 3,090,207 | 5/1963 | Smith et al. | 62/3 |
| 3,136,134 | 6/1964 | Smith | 62/3 |
| 3,481,796 | 12/1969 | Brown | 148/1.6 |
| 4,500,742 | 2/1985 | Morimoto et al. | 136/206 |

Primary Examiner—Donald P. Walsh
Assistant Examiner—Chrisman D. Carroll
Attorney, Agent, or Firm—Limbach & Limbach

[57] ABSTRACT

In a thermoelectric refrigeration material with thermoelectric conversion characteristic, in order to improve crystallinity of a system of bismuth-antimony (Bi-Sb) and thereby to improve the figure of merit Z, bismuth (Bi), antimony (Sb) and silicon monoxide (SiO) are deposited on a substrate at a predetermined rate in a thermally nonequilibrium state by an ICB method so that a thin film crystal having a granular structure including crystal grains of around one micron is obtained. Consequently, the figure of merit Z can be improved by selectively varying the thermal conductivity K which largely depends upon the crystallinity and which is one of elements of the figure of merit Z determining the thermal conversion coefficient.

14 Claims, 7 Drawing Sheets

THERMOELECTRIC REFRIGERATION MATERIAL AND METHOD OF MAKING THE SAME

BACKGROUND OF THE INVENTION

This invention relates to a thermoelectric refrigeration material suitable for thermoelectric elements having a thermoelectric conversion characteristic and performing a refrigerating operation when an electric current flows therethrough and a method of making the same.

The Peltier effect is usually utilized in refrigerators employing thermoelectric elements for performing the refrigeration. The thermoelectric element comprises two kinds of metals differing from each other in the electric characteristics or semiconductors bonded together. A current is caused to flow across both ends of the thermoelectric element such that heat absorbing or heating phenomena are caused. A refrigerating action can be obtained from the heat absorbing phenomena.

Various materials have been found as those with the Peltier effect. Semiconductive materials such as a system of bismuth (Bi) and antimony (Sb) or a system of bismuth and tellurium (Te) show an eminent effect as the thermoelectric refrigeration material. These semiconductive materials have been formed in a metallurgical thermally equilibrium condition and p-type and n-type conductors are combined to form the thermoelectric element.

It is desirable that the thermoelectric refrigeration material employed to form the thermoelectric element should have high thermoelectric conversion efficiency. However, the thermoelectric conversion efficiencies of the hitherto found thermoelectric materials are so low that they are not effective means for performing refrigeration in household refrigerators or the like having a relatively large capacity. Consequently, the thermoelectric refrigeration materials have conventionally had limited usage such as infrared detectors or semiconductor laser diodes in which a local refrigeration is performed or the case of temperature control when objects refrigerated have small volume or capacity.

A figure of merit Z presented by the following equation is generally used to evaluate the thermoelectric conversion performance of the above-described thermoelectric refrigeration materials:

$$Z = S^2 \cdot \sigma / K \tag{1}$$

where S is the thermoelectric power, $\sigma$ is an electric conductivity, and K is thermal conductivity. The thermoelectric conversion efficiency becomes higher as the figure of merit Z is increased. To increase the figure of merit Z, it is desirable to increase the thermoelectric power S and the electric conductivity $\sigma$ and to reduce the thermal conductivity K, as obvious from the equation (1).

In the prior art, however, many trials to improve the performance of the thermoelectric refrigeration materials have been directed mainly to obtaining a material having a large value of the thermoelectric power S depending upon properties peculiar thereto, thereby improving the figure of merit Z of the thermoelectric refrigeration material. These conventional trials have not improved the figure of merit Z as much as expected.

The inventors have considered that reducing the denominator of the equation (1) or the thermal conductivity K should be expedient so that the figure of merit Z is improved to a large extent. However, it has been difficult to control the thermal conductivity in accordance with the conventional metallurgical method, and the control of the thermal conductivity have not been successfully performed hitherto.

SUMMARY OF THE INVENTION

Therefore, an object of the present invention is to provide a thermoelectric refrigeration material wherein the figure of merit Z of the material of the bismuth-antimony (Bi-Sb) system can be improved so that the thermoelectric conversion efficiency can be improved and the thermoelectric refrigeration material can be applied in a wider range of fields and a method of making such an improved thermoelectric refrigeration material.

To achieve the above-described object, the present invention provides a thermoelectric refrigeration material having a thermoelectric conversion characteristic and formed by adding silicon monoxide (SiO) to a system of bismuth-antimony (Bi-Sb) at a predetermined rate such that the formed material has a granular crystalline structure containing crystal grains of around one micron.

In accordance with the present invention, the thermoelectric refrigeration material has a granular crystalline structure containing crystal grains of around one micron. Consequently, the value of the thermal conductivity K in the figure of merit Z indicative of the thermoelectric conversion performance is reduced though the values of the thermoelectric power S and the electric conductivity in the figure of merit Z hardly vary.

The reason for this will be described. The figure of merit Z indicative of the thermoelectric conversion performance is represented by the above-described equation (1):

$$Z = S^2 \cdot \sigma / K \tag{1}$$

where S is the thermoelectric power, o is the electric conductivity, and K is the thermal conductivity. Since the thermoelectric power S is peculiar to individual substances, it takes a fixed value in the material of the Bi-Sb system.

Furthermore, the wave length of oscillation of electrons propagating in a solid body is far shorter than the wave length of thermal oscillation (phonon) of a crystal lattice. Consequently, the crystallinity does have little effect on the electric conductivity $\sigma$. Accordingly, the value of the electric conductivity $\sigma$ hardly varies as compared with that in the prior art when crystal grains of about one micron are formed.

The thermal conductivity K largely depends upon the crystallinity of the substance. The thermoelectric refrigeration material of the present invention has a granular crystalline structure and the thermal conductivity thereof differs from that in the prior art as follows. That is, the thermal conductivity K is generally represented by the following equation (2):

$$K = K_{el} + K_{ph} \tag{2}$$

where $K_{el}$ is the thermal conductivity due to carriers participating in the electrical conduction and $K_{ph}$ is the thermal conductivity due to phonon. The wave length is short in the thermal conduction due to the carriers and accordingly, the heat has a property that it is difficult to be scattered in a grain boundary. This property has little effect on the crystallinity. On the other hand, the wave length is long in the thermal conduction due to the phonon and accordingly, the heat has a property that it is easy to be scattered in the grain boundary. However, the thermal conductivity due to the phonon is smaller in the thermoelectric refrigeration material of the present invention than in the conventional crystalline structure since the material has a granular structure of around one micron.

The figure of merit Z represented by the above-described equation (1) thus takes a large value since the value of the denominator of the equation (1) or the thermal conductivity K is rendered small. Consequently, the thermoelectric refrigeration material of the present invention has a high thermal conversion efficiency.

It is preferable that the rate at which SiO is added be approximately 2 atomic percentage or below. The silicon monoxide is electrically an insulator. The electrical characteristics of the thermoelectric refrigeration material is deteriorated when the rate of addition of SiO becomes excessive.

It is also preferable that Bi and Sb in the Bi-Sb system be approximately in the ratio of 88:12.

The present invention also provides a method of making the thermoelectric refrigeration material, comprising a step of depositing bismuth (Bi), antimony (Sb) and silicon monoxide (SiO) on a substrate at a predetermined rate by a thermally nonequilibrium evaporation so that a thin film of the thermoelectric refrigeration material is formed.

The growth process of the crystal in the thermally nonequilibrium condition differs from that in the conventional thermally equilibrium condition. The crystal grows in the thermally nonequilibrium condition so as to have the crystalline structure containing crystal grains of around one micron.

It is preferable that an ionized cluster beam (ICB) method be employed as the thermally nonequilibrium evaporation.

In accordance with the ICB method, the electric charge versus mass (e/m) ratio of the flow of the deposited substance can be rendered one thousandth or below that in the case where the thin film is deposited in the form of monoatomic ion. Consequently, a large amount of particles of the deposited substance can be rapidly transferred with low acceleration even onto the substrate as the insulation material without any obstruction due to occurrence of space charge. Furthermore, by an effect of migration peculiar in the collision of the deposited substance particles against the substrate or the effect of diffusion of the particles on the substrate surface, the substance particles are piled up on the substrate with strong adhesion, uniform film thickness and smooth surface. Thus, the ICB method can provide a high performance thin film readily formed though it cannot be formed in the conventional method of thin film formation by the use of thermal or chemical energy in the thermally equilibrium condition.

Only Bi clusters may be ionized in the ICB method. An applied voltage for ionizing the Bi clusters may be approximately at 400 volts and a current of approximately 100 milli-amperes may be provided for ionizing the Bi clusters.

The substrate may preferably be a glass plate. The vacuum pressure in a deposition area may be maintained at an approximate value of $2 \times 10^{-6}$ Torr during the vacuum evaporation.

Furthermore, an amount of SiO added may be adjusted by controlling a calorific value of a heater for heating a pot accommodating SiO.

Other objects of the present invention will become obvious upon understanding of the illustrative embodiment about to be described. Various advantages not referred to herein will occur to one skilled in the art upon employment of the invention in practice.

BRIEF DESCRIPTION OF THE DRAWINGS AND PHOTOGRAPHS

The embodiment of the present invention will be described with reference to the accompanying drawings and photographs, in which.

PHOTO 1 is an electron microscopic photograph showing the crystalline structure of the sample to which no silicon monoxide is added;

PHOTO 2 is an electron microscopic photograph showing the crystalline structure of the sample (1.30 atomic percentage) to which silicon monoxide is added; and PHOTO 3 is an electron microscopic photograph showing the crystalline structure of the sample (2.76 atomic percentage) to which silicon monoxide is added.

DESCRIPTION OF THE PREFERRED EMBODIMENT

Figure 1:
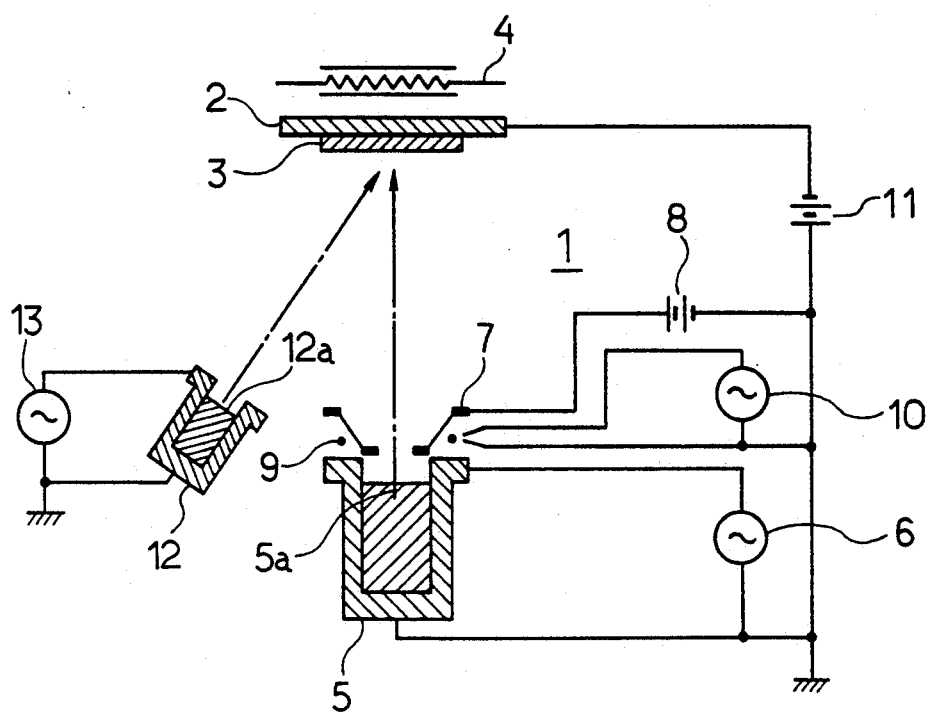
FIG. 1 is a schematic diagram of a vacuum evaporator employing the ICB method.

An embodiment of the present invention will be described with reference to the accompanying drawings and photographs. FIG. 1 schematically illustrates an apparatus for performing a vacuum evaporation by an ionized cluster beam method (ICB method) as a thermally nonequilibrium evaporation method. The interior of an evaporation chamber 1 is degassed into vacuum condition. A substrate holder 2 is mounted in the upper interior of the evaporation chamber 1. An insulation material such as a glass plate 3 held on the lower side of the substrate holder 2 so that a deposition face of the substrate 3 is directed downwards. A heater 4 is provided over the substrate holder 2 or at the backside thereof for heating the substrate 3 to a predetermined temperature.

A closed type main pot 5 is provided in the lower interior of the evaporation chamber 1 for accommodating bismuth (Bi) serving as an evaporation source. The main pot 5 is provided with a heater (not shown) connected to a heater power source for melting bismuth. The main pot 5 is further provided with a nozzle 5a through which vapor generated by the molten bismuth is injected. An ionization unit 7 is provided over the nozzle 5a for ionizing the bismuth vapor injected from it. An ionizing d.c. power source 8 is connected to the ionization unit 7 so that a predetermined voltage is applied to the ionization unit 7. In the vicinity of the ionization unit 7 is provided a heater 9 powered by a heater power source 10. An acceleration power source 11 is connected between the main pot 5 and the substrate holder 2 so that the ionized bismuth evaporation source is accelerated in an electric field so as to collide with the substrate 3 held by the substrate holder 2.

A subpot 12 is provided in the vicinity of the main pot 5a for accommodating antimony (Sb) serving as an evaporation source. The subpot 12 also has a heater (not shown) connected to a heater power source 13 for melting antimony and an injection nozzle 12a through which the molten antimony vapor is injected. Another subpot (not shown) generally same as the subpot 12 is provided in the vicinity thereof for accommodating silicon monoxide (SiO) serving as an evaporation source. The subpot for accommodating silicon monoxide is provided with a tungsten wire heater (not shown) for heating the subpot. An amount of silicon monoxide injected or added is increased as the current flowing in the heater is increased.

The process of evaporation by the ICB method and its characteristics will now be described. In the ICB method, evaporated atoms are loosely combined with one another so as to form clusters. The clusters in the flow of the evaporated substance composed of groups of such clusters are ionized at a desirable ratio so that kinetic energy of the evaporated substance flow is controlled, whereby the speed at which the atoms of the evaporated substance collide with the substrate is varied in a wide range, resulting in improvement in degree of freedom of the deposited thin film forming. Consequently, the thin film forming by the ICB method provides optional changes in the crystallinity of the deposited thin film such as adherence strength against the substrate or preference orientation of crystallographic axis or in other physical or chemical properties. More specifically, the evaporated substance or bismuth is accommodated in the main pot 5 in the vacuum chamber 1 and then, the heater power source 6 is activated so that the main pot 5 is heated. The evaporated substance (bismuth) is thus converted into high pressurized vapor, which vapor is injected from the nozzle 5a of the main pot 5 into the vacuum chamber 1. In this case, since the evaporated substance or bismuth is frozen by supercooling due to adiabatic expansion, clusters each composed of about 500 to 2,000 atoms loosely combined with one another are formed.

The evaporated atoms (bismuth) injected from the main pot 5 are caused to fly as the groups of clusters toward the substrate 3. During the flight, the clusters suffer an electron shower by the ionization unit 7 and consequently, only one of about 500 to 2,000 atoms composing part of the clusters is ionized. The flow of the evaporated substance thus containing ionized and unionized clusters is moved to the substrate 3 and deposited on it, forming a thin film. In this case the cluster groups have energy corresponding to an initial speed at which they are injected from the main pot 5. Furthermore, the ionized clusters are accelerated to a desirable speed by an acceleration voltage applied when necessary. Accordingly, the energy of the clusters can be controlled in a wide range when the clusters collide with the substrate 3. Since the ionization rate of the clusters and the acceleration voltage applied to the clusters are thus controlled, the formed thin film can be controlled so as to change its characteristics in various modes.

In forming the thin film in accordance with the above-described ICB method, the electric charge versus mass (e/m) ratio of the flow of the deposited substance can be rendered one thousandth or below that in the case where the thin film is deposited in the form of monoatomic ion. Consequently, a large amount of particles of the deposited substance can be rapidly transferred with low acceleration even onto the substrate as the insulation material without any obstruction due to occurrence of space charge. Furthermore, by an effect of migration peculiar in the collision of the deposited substance particles against the substrate 3 or the effect of diffusion of the particles on the substrate surface, the substance particles are piled up on the substrate with strong adhesion, uniform film thickness and smooth surface. Thus, the ICB method can provide a high performance thin film readily formed though it cannot be formed in the conventional method of thin film formation by the use of thermal or chemical energy in the thermally equilibrium condition.

The inventors made an experiment about the thermoelectric refrigeration material formed by adding a predetermined amount of silicon monoxide (SiO) to the material of bismuth-antimony (Bi-Sb) system in accordance with the above-described ICB method. The results of the experiment will now be described. Bismuth (Bi) as the evaporation source is accommodated in the main pot 5 for ionization and antimony (Sb) is accommodated in the subpot 12. Silicon monoxide (SiO) is also accommodated in another subpot (not shown). The applied voltage of the ionization unit 7 of the main pot 5 takes the value of 400 V and the ionization current takes the value of 100 mA. The substrate 3 is heated by the substrate heater 4 to the temperature of 200° C. The vacuum pressure in the interior of the evaporation chamber 1 is $2 \times 10^{-6}$ Torr. Bi and Sb in the Bi-Sb system employed in the experiments is in the composition ratio of 88:12. The obtained thin film has the film thickness of 4,000 angstrom. The amount of silicon monoxide (SiO) added is used as a parameter and the atomic percentage as the amount of SiO added is varied by changing the value of the heater current. In the experiment, the current flowing in the heater heating the silicon monoxide is determined to take the value of 60 A such that the amount of SiO added takes the value of 1.30 atomic percentage.

Figure 2:
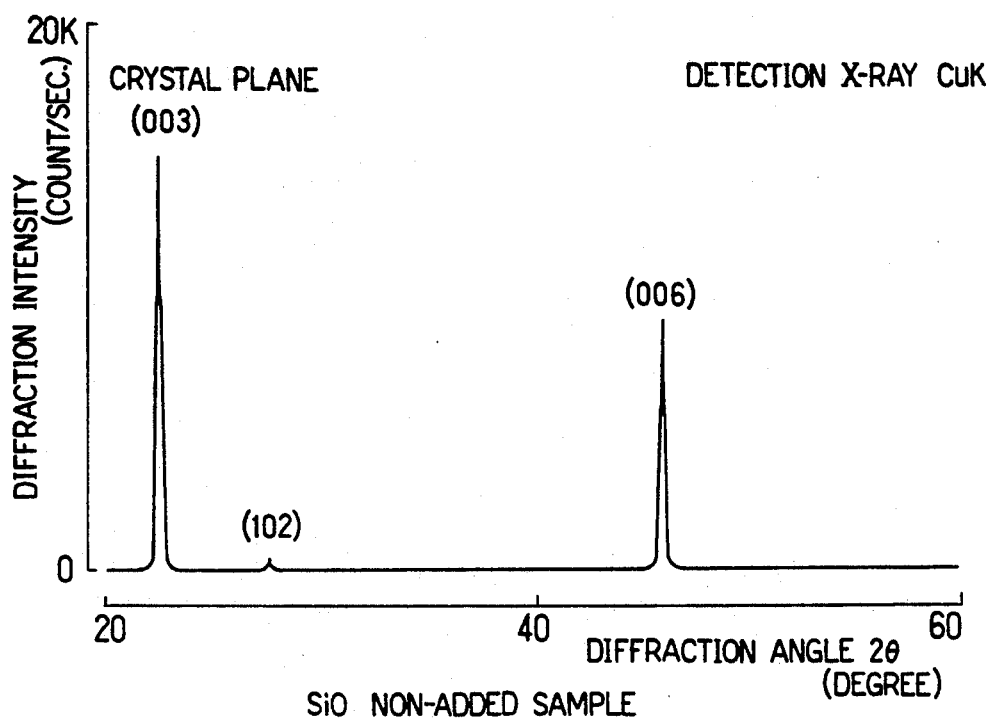
FIG. 2 is a graph showing the result of X-ray diffraction pattern measurement with respect to a sample to which no silicon monoxide is added.
Figure 3:
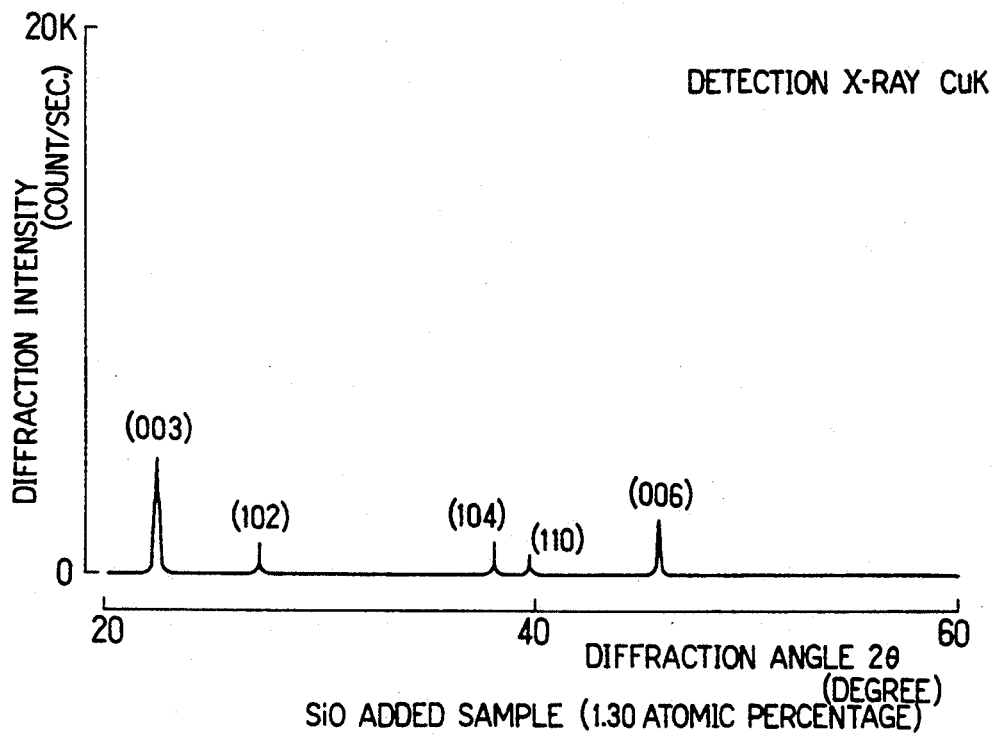
FIG. 3 is a graph showing the result of X-ray diffraction pattern measurement with respect to a sample to which silicon monoxide is added.

The inventors also made a non-added sample to which silicon monoxide was not added, in addition to the above-described SiO added sample. The results of various characteristic evaluations of these two kinds of samples will be described. FIG. 2 shows the result of X-ray diffraction pattern measurement with respect to the sample to which no silicon monoxide is added. FIG. 3 shows the result of X-ray diffraction pattern measurement with respect to the sample to which silicon monoxide is added. PHOTO 1 is an electron microscopic photograph showing the crystalline structure of the sample to which no silicon monoxide is added. PHOTO 2 is an electron microscopic photograph showing the crystalline structure of the sample (1.30 atomic percentage) to which silicon monoxide is added. PHOTO 3 is an electron microscopic photograph showing the crystalline structure of the sample (2.76 atomic percentage) to which silicon monoxide is added.

As obvious from FIGS. 2 and 3, in the SiO non-added sample, a strong reflection peak appears at crystal planes (003) and (006) and the crystallinity is oriented to the c-axis. On the other hand, in the SiO added sample, the diffraction peak appears at the crystal planes (102), (104) and (110) relatively strongly and the axial orientation has broken down.

PHOTOS 2 and 3 show that the deposited thin film in the case of the SiO non-added sample is composed of a large number of microcrystals in the order of one micron. Evaluated based both on the electron microscopic photos and the above-described results of measurement of the X-ray diffraction pattern, it is found that the SiO added sample has a granular crystalline structure with the crystallographic axis orientation disorderly to some extent. However, it is preferable that the rate at which SiO is added be approximately 2 atomic percentage or below since the silicon monoxide is electrically an insulator. The electrical characteristics of the thermoelectric refrigeration material is deteriorated when the rate of addition of SiO becomes excessive.

Figure 4:
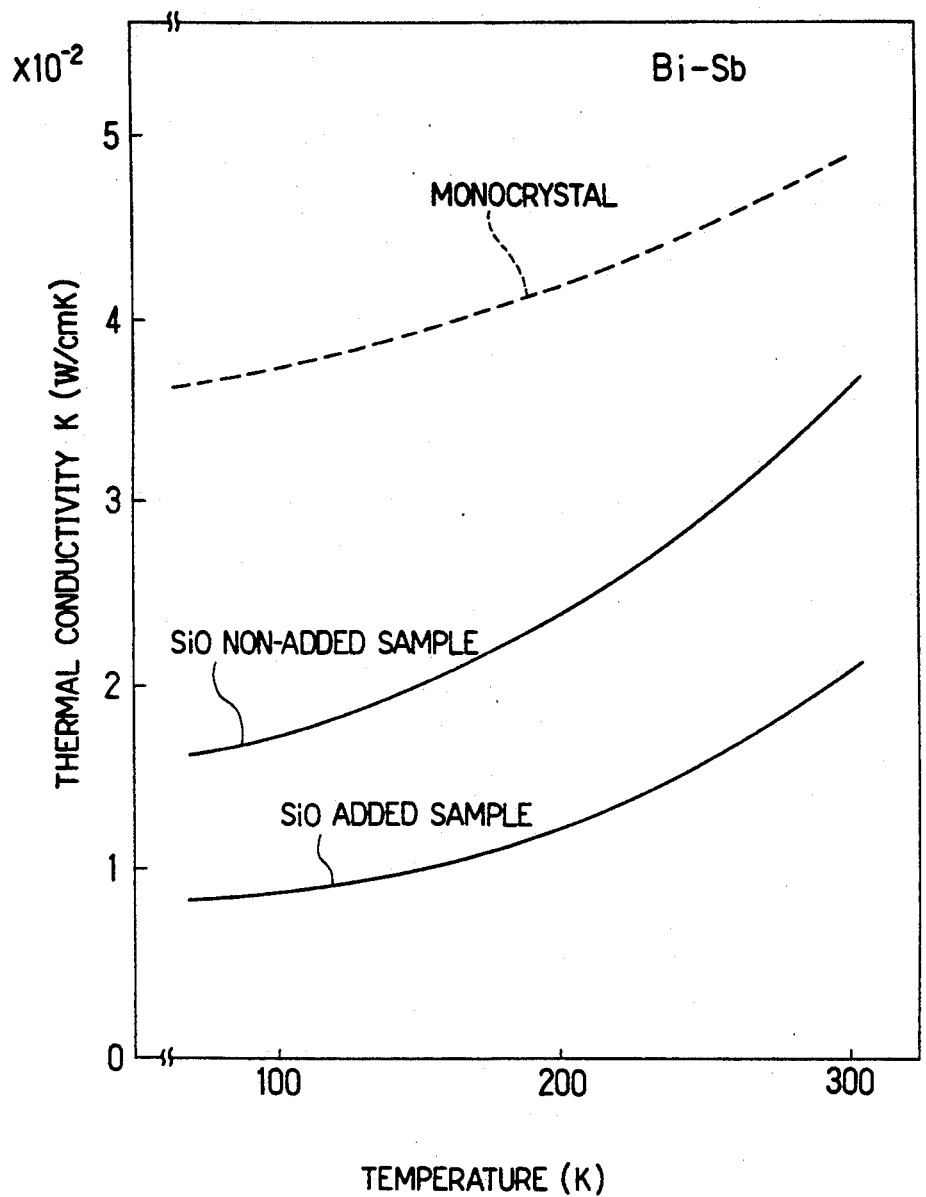
FIG. 4 is a graph showing the results of measurement of the thermal conductivity K.

The inventors then examined whether or not the figure of merit Z has been improved in correspondence with the above described evaluation of the crystallinity. For this purpose, the inventors measured characteristics of the elements in equation (1). FIGS. 4 through 7 show the results of measurement of the thermal conductivity K, the thermoelectric power S, electric conductivity $\sigma$, and the figure of merit Z respectively. In each graph, the broken line indicates reference data with respect to a monocrystal of the Bi-Sb system. First, FIG. 4 shows the results of measurement of the thermal conductivity K of each of the SiO added and non-added samples as the function of temperature. As obvious from the results, the value of the thermal conductivity K of the SiO added sample is about 50% smaller than that of the SiO non-added sample. The reason for this is as follows: the thin film sample has a granular crystalline structure and the orientation of the crystallographic axis is disorderly to some extent as the result of addition of silicon monoxide, as described above, resulting in reduction in the thermal conductivity $K_{ph}$ due to phonon.

Figure 5:
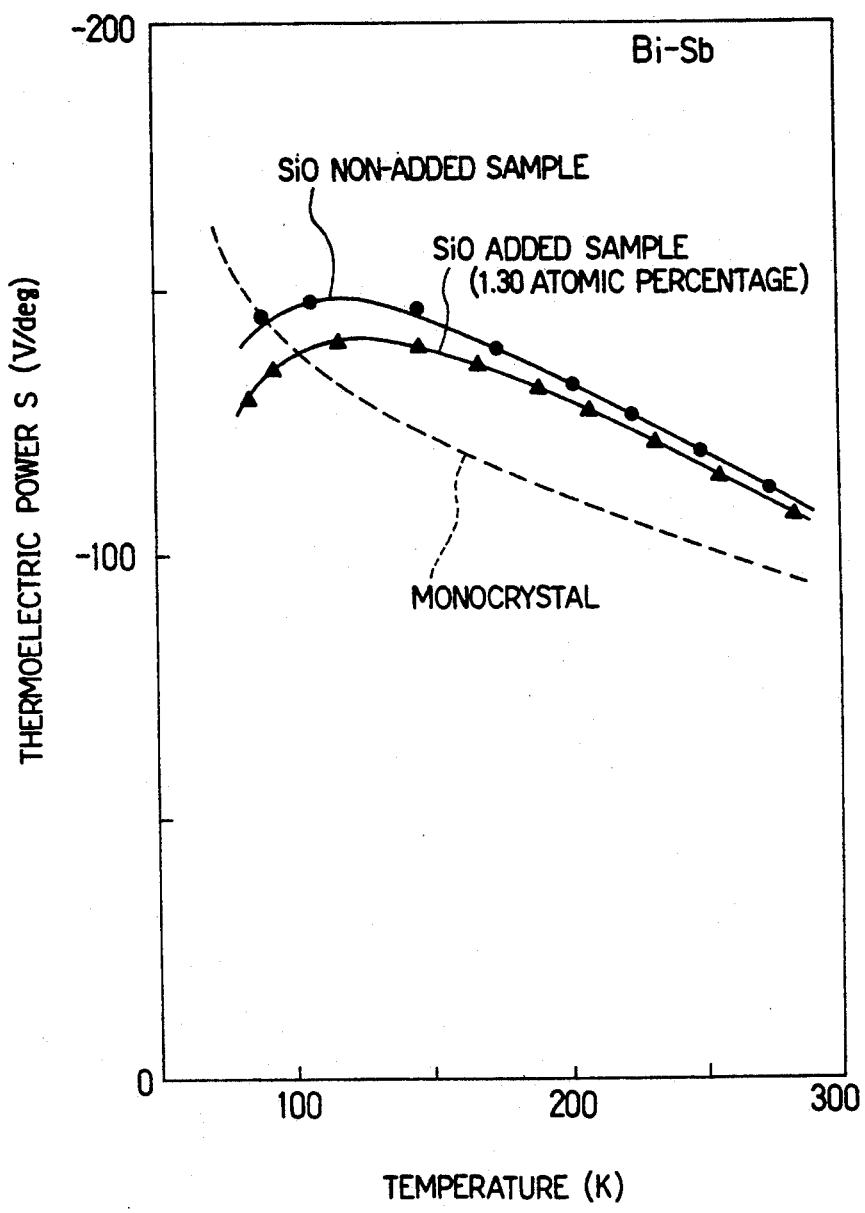
FIG. 5 is a graph showing the results of measurement of the thermoelectric power S.
Figure 6:
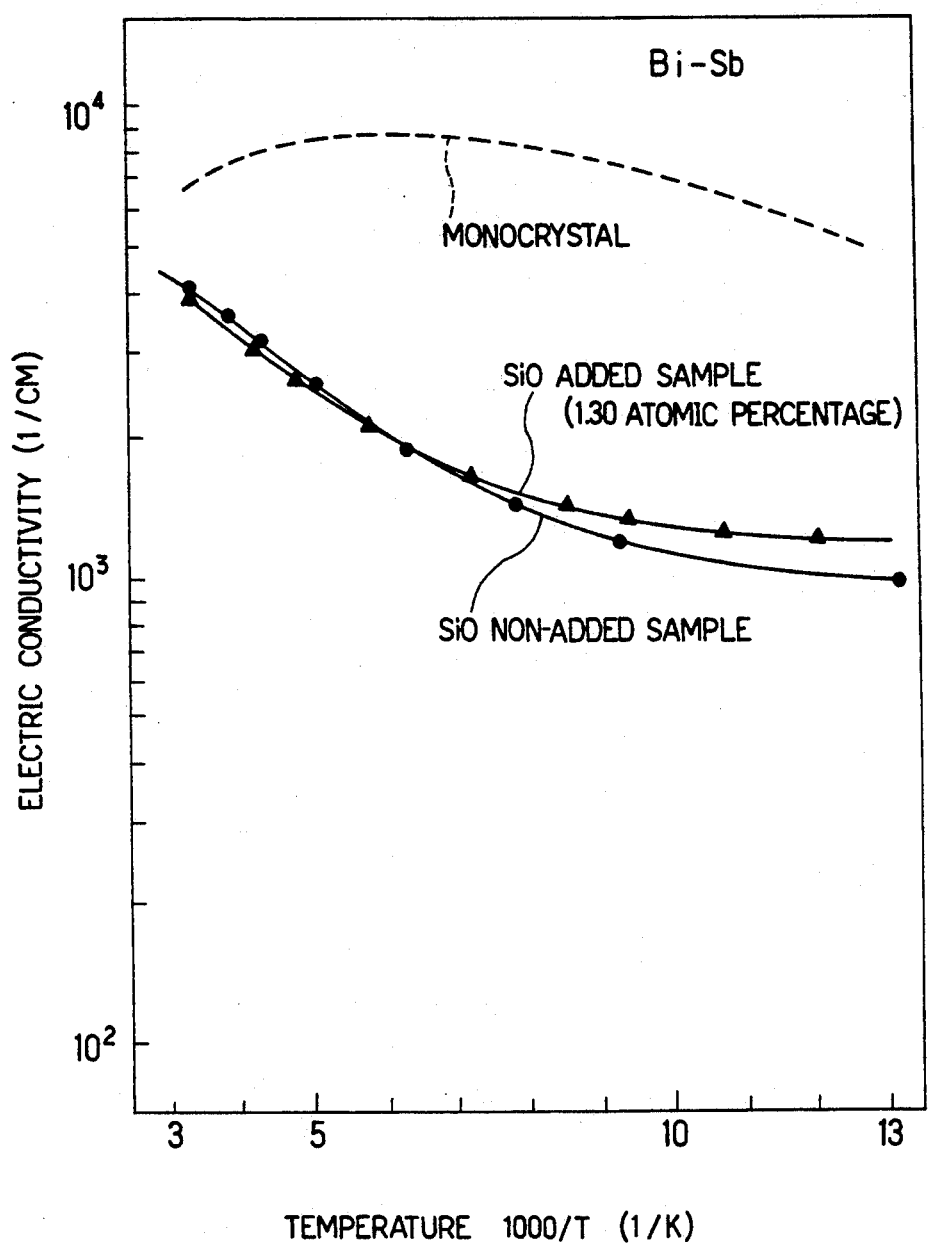
FIG. 6 is a graph showing the results of measurement of the electric conductivity.

Referring to FIGS. 5 and 6 showing the results of measurement of the thermoelectric power S and the electric conductivity $\sigma$ respectively, it can be found that there is little difference between the thermoelectric power S and the electric conductivity in the SiO added sample and those in the SiO non-added sample. That is, the thermoelectric power S is peculiar to individual substances and the electric conductivity $\sigma$ is not so much influenced by the crystallinity. Consequently, there is little difference between these values of the SiO added and non-added samples even when the crystallinity is changed by the addition of silicon monoxide.

Figure 7:
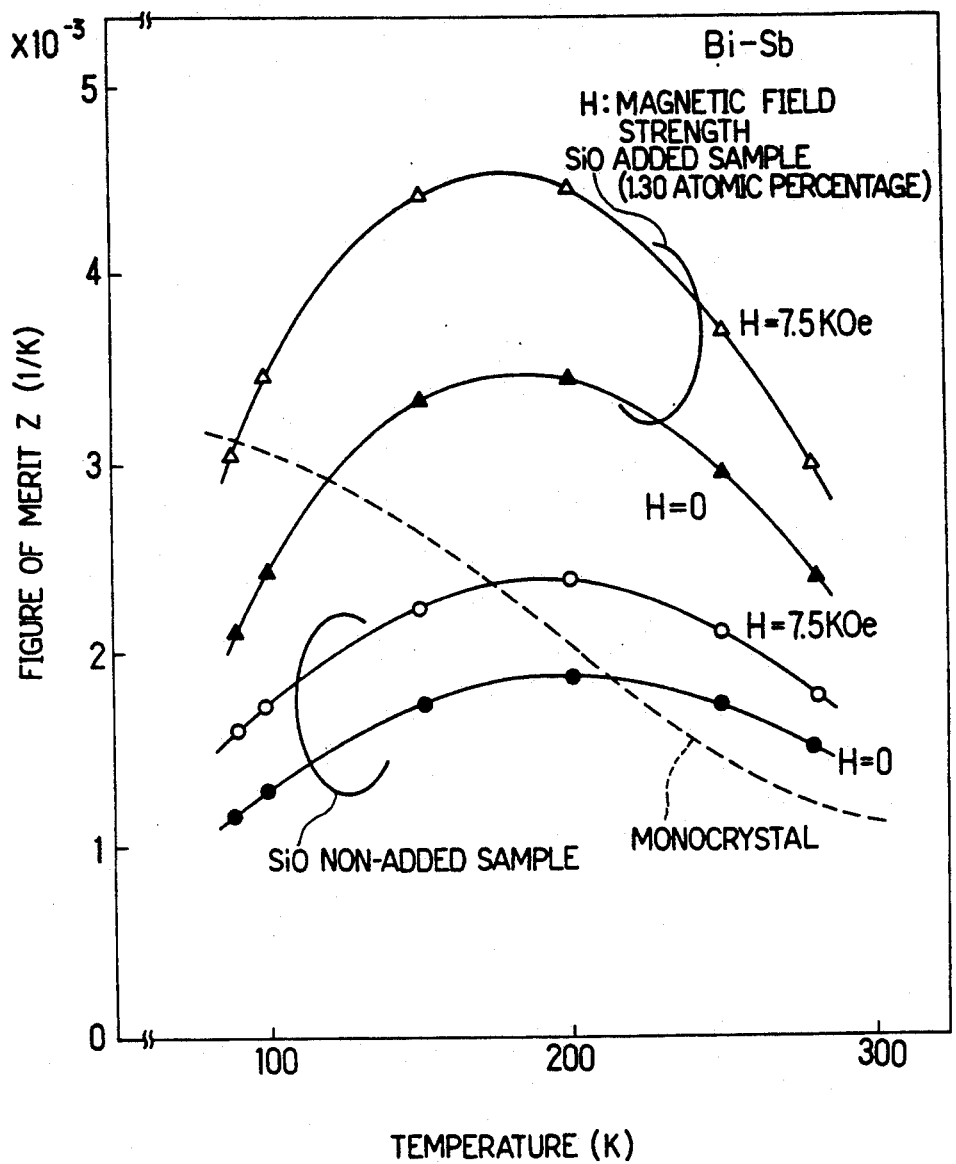
FIG. 7 is a graph showing the results of calculation of the figure of merit Z.
Figure 8A:
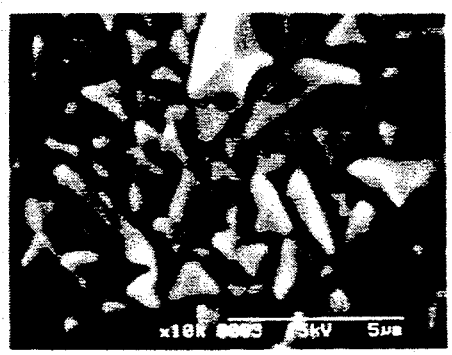
Figure 8B:
Figure 8C:
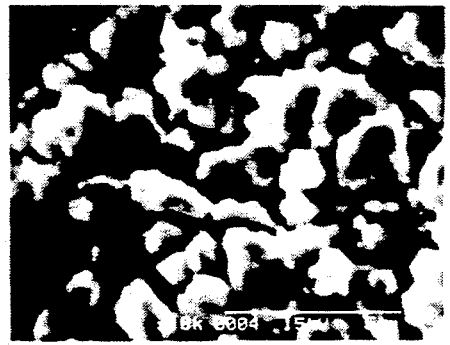

FIG. 7 shows the results of calculation of the figure of merit Z based on the above-described measurement results. In FIG. 7, the figure of merit Z of the SiO added sample is improved by 50% as compared with that of the SiO non-added sample. Furthermore, the figure of merit Z can be obtained from equation (1) in the state that the magnetic field of 7.5 kOe:

$$Z = 4.5 \times 10^{-3} (K^{-1}).$$

In accordance with the above-described embodiment, silicon monoxide is added to the semiconductor material of the bismuth-antimony system at the predetermined rate and the crystal has a granular structure so that only the thermal conductivity K which is one of the factors determining the value of the figure of merit Z can be reduced. Consequently, the figure of merit Z can be increased and thermoelectric conversion efficiency can be improved.

The thin film crystal is made in a thin film forming method in accordance with the ICB method as the thermally nonequilibrium means so that the thermal conductivity K is reduced. Consequently, the process of growth of the crystal differs from than in the conventional thermally equilibrium method, resulting in production of crystals of good quality in an easy manner.

Although the ICB method is employed as the thermally nonequilibrium method in the foregoing embodiment, other methods of making crystals by ionizing the evaporation sources in the thermally nonequilibrium state may be employed.

The foregoing disclosure, drawings and photos are merely illustrative of the principles of the present invention and are not to be interpreted in a limiting sense. The only limitation is to be determined from the scope of the appended claims.

We claim:

1. A thermoelectric refrigeration material having a thermoelectric conversion characteristic and formed by adding silicon monoxide (SiO) to a system of bismuth-antimony (Bi-Sb) at a predetermined rate such that the formed material has a granular crystalline structure containing crystal grains of around one micron.

2. A thermoelectric refrigeration material according to claim 1, wherein the rate at which SiO is added is approximately 2 atomic percentage or below.

3. A thermoelectric refrigeration material according to claim 1, wherein Bi and Sb in the system of Bi-Sb is approximately in the ratio of 88:12.

4. A thermoelectric refrigeration material according to claim 1, wherein the thermoelectric refrigeration material is formed on a substrate in the form of a thin film.

5. A method of making the thermoelectric refrigeration material according to claim 1 comprising a step of depositing bismuth (Bi), antimony (Sb) and silicon monoxide (SiO) on a substrate at a predetermined rate by a thermally nonequilibrium evaporation so that a thin film of the thermoelectric refrigeration material is formed.

6. A method according to claim 5, wherein an ionized cluster beam (ICB) method is employed as the thermally nonequilibrium evaporation.

7. A method according to claim 6, wherein only Bi clusters are ionized.

8. A method according to claim 7, wherein an applied voltage for ionizing the Bi clusters is approximately at 400 volts and a current of approximately 100 milliamperes is provided for ionizing the Bi clusters.

9. A method according to claim 5, wherein the substrate is a glass plate.

10. A method according to claim 5, wherein the substrate is maintained at approximately 200° C. during deposition.

11. A method according to claim 5, wherein the vacuum pressure in a deposition area is maintained at an approximate value of $2 \times 10^{-6}$ Torr during deposition.

12. A method according to claim 5, wherein an amount of SiO added is adjusted by controlling a calorific value of a heater for heating a pot accommodating SiO.

13. A method according to claim 5, wherein the rate at which SiO is added is approximately 2 atomic percentage or below.

14. A method according to claim 5, wherein Bi and Sb in the system of Bi-Sb is approximately in the ratio of 88:12.

* * * * *